United States Patent [19]

Kawagoe

[11] 4,240,151
[45] Dec. 16, 1980

[54] SEMICONDUCTOR READ ONLY MEMORY

[75] Inventor: Hiroto Kawagoe, Kodaira, Japan

[73] Assignee: Hitachi, Ltd., Japan

[21] Appl. No.: 875,012

[22] Filed: Jan. 25, 1978

Related U.S. Application Data

[63] Continuation of Ser. No. 656,854, Feb. 10, 1976, abandoned.

[30] Foreign Application Priority Data

Feb. 10, 1975 [JP] Japan .................................. 50-16280

[51] Int. Cl.³ ............................................. G11C 17/06
[52] U.S. Cl. .................................. 365/104; 340/166 R
[58] Field of Search ......................... 365/94, 103, 104; 340/166 R, 166 S, 347 DD; 307/205, 215, 251, DIG. 5

[56] References Cited

U.S. PATENT DOCUMENTS

| | | | |
|---|---|---|---|
| 3,866,186 | 2/1975 | Suzuki | 365/104 |
| 3,934,233 | 1/1976 | Fisher et al. | 307/DIG. 5 |
| 4,016,430 | 4/1977 | Kanezuka | 307/205 |
| 4,023,122 | 5/1977 | Oura | 307/251 |
| 4,069,427 | 1/1978 | Masuda | 365/104 |

OTHER PUBLICATIONS

Wilder et al., Multiple Selective Write Alterable Read-Only Storage, IBM Tech. Disc. Bul., vol. 17, No. 9, 2/75, pp. 2594-2595.

Primary Examiner—Stuart N. Hecker
Attorney, Agent, or Firm—Craig and Antonelli

[57] ABSTRACT

In a circuit arrangement wherein a memory matrix and an address decoder are constructed of read only memories (ROMs), a semiconductor read only memory is characterized in that at least the address decoder ROM in which the number of output lines to be selected is smaller than that of output lines not be selected is made of a longitudinal system in which a plurality of MISFETs are connected in series between respective output lines arranged in a column and a reference voltage terminal, the MISFETs forming a desired pattern in a row, and that current is permitted to flow through only a load MISFET connected with a selected one of the address select lines.

34 Claims, 11 Drawing Figures

SEMICONDUCTOR READ ONLY MEMORY

CROSS-REFERENCE TO RELATED APPLICATION

This application is a continuation of Application Ser. No. 656,854, entitled "SEMICONDUCTOR READ ONLY MEMORY", filed Feb. 10, 1976, now abandoned.

LIST OF PRIOR ART (37 CFR 1.56 (a))

The following references are cited to show the state the art:
(1) U.S. Pat. No. 3,825,888, Hiroto Kawagoe, July 23, 1974, class 340/347DD.
(2) U.S. Pat. No. 3,866,186, Yasoji Suzuki, Feb. 11, 1975, class 340/173SP.
(3) U.S. Pat. No. 4,016,430, Tadao Kanezuka, Apr. 5, 1977, class 307/205.
(4) U.S. Pat. No. 3,865,651, Shigeru Arita, Feb. 11, 1975 class 148/187.

BACKGROUND OF THE INVENTION

1. Field of the Invention

This invention relates to a semiconductor read only memory (hereinbelow termed an "ROM"), and more particularly to an ROM in which a plurality of insulated gate field-effect transistors (hereinafter called "MISFETs") are connected in series to one output line.

2. Description of the Prior Art

In general, a circuit in which both a memory matrix and an address decoder are constructed of ROMs employs ROMs of the lateral system (ROMs in which a plurality of driving MISFETs are connected in parallel between an output terminal and a reference voltage terminal) as disclosed in 'Electronics Digest' December 1973, pp. 49-50, "7. READ only MEMORY" etc.

Figure 1:
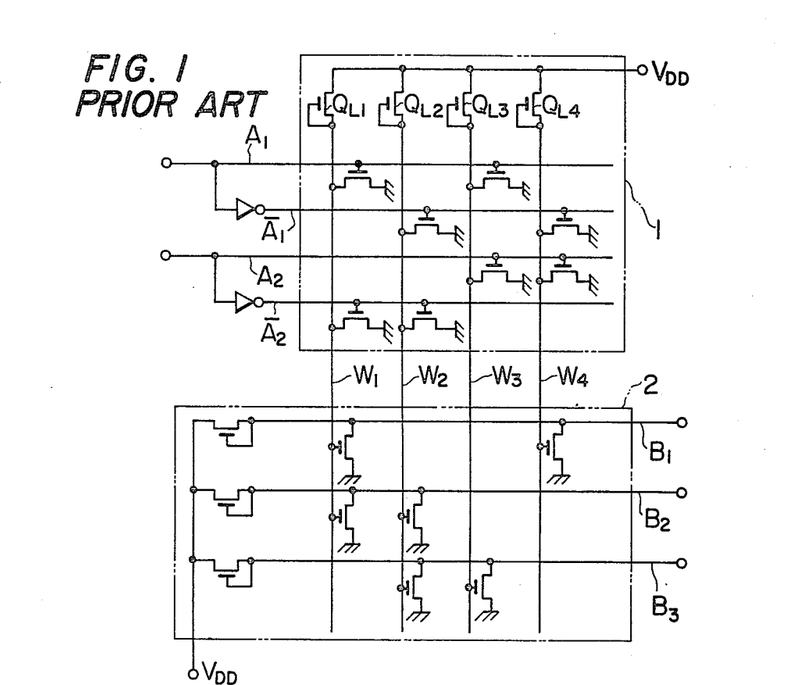
FIG. 1 shows a circuit diagram where a word address decoder and a memory matrix are built up by ROMs of a prior art lateral system.

FIG. 1 shows an address decoder, especially a word address decoder, an ROM 1, and a memory matrix ROM 2 which are formed by the above system. In the figure, the word address decoder ROM 1 decodes an encoded address signal applied from address input lines $A_1$, $\overline{A}_1$, $A_2$ and $\overline{A}_2$ and selects one of the word address select lines $W_1-W_4$. The memory matrix ROM 2 is an ROM which stores 12 bits (4 words × 3 bits). The stored contents (3 bits) of the selected column (word) in the ROM are read out from bit output lines $B_1-B_3$.

In the memory matrix ROM 2, the selected word address select line is connected to a supply voltage $V_{DD}$, whereas the non-selected word address select lines are grounded.

This means that, in the word address decoder ROM 1, current flows through all but one of the load MISFETs $Q_{L1}-Q_{L4}$ which are connected to the word address lines $W_1-W_4$. As a result, a large amount of power is dissipated in the word address decoder ROM 1. Where the memory capacity of the memory matrix ROM 2 is increased, the number of the non-selected word address select lines is increased accordingly, and the problem becomes more serious.

Figure 2A:
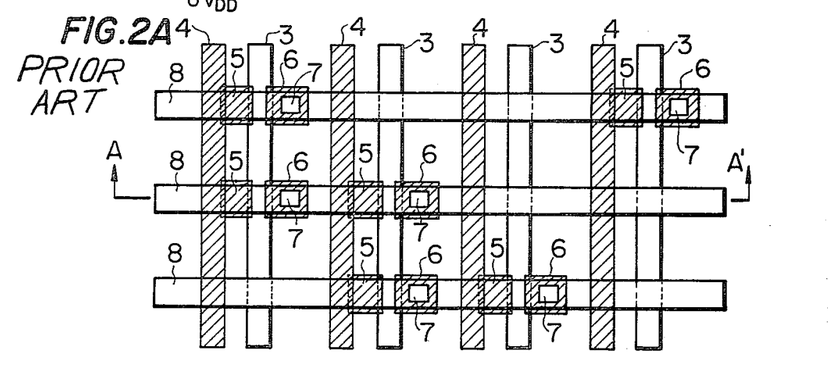
FIG. 2A shows a pattern diagram where a part of the memory matrix ROM in FIG. 1 is assembled in an MISLSI.
Figure 2B:
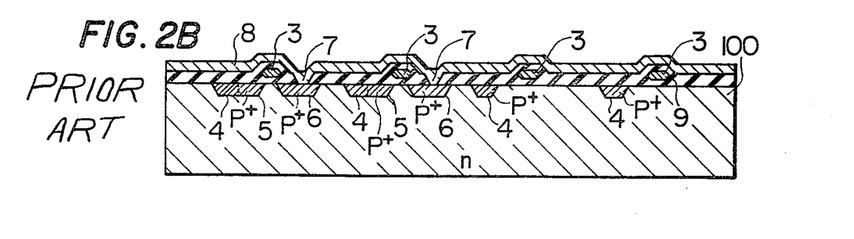
FIG. 2B is a front sectional view taken along A-A' in FIG. 2A.

FIG. 2A shows a pattern diagram where a part of the memory matrix ROM 2 illustrated in FIG. 1 is assembled in a chip of a P-channel type MISLSI. FIG. 2B is a front sectional view along line A-A' in FIG. 2A.

In the figures, numeral 3 designates a portion formed of Si, which forms the gate electrodes of MISFETs disposed in each column and which is also the word address select line. Numeral 5 indicates a source region of each MISFET, numeral 4 a ground interconnection layer for commonly grounding the source regions 5 of the MISFETs disposed in each column, and numeral 6 a drain region of each MISFET. The ground interconnection layer 4, the source region 5 and the drain region 6 are formed of high concentration P+-type diffused layers, respectively. Numeral 7 (at the blank part inside the oblique lines of the drain region 6) denotes a contact window which is formed in an insulating layer 9 on each drain region 6, and numeral 8 is an Al interconnection layer (corresponding to the bit output line $B_1-B_3$) which serves to commonly connect the drain regions 6 of the MISFETs in the respective columns. The connection between the drain region 6 and the Al interconnection layer 8 is effected through the contact window. The pattern of the ROM or the configuration of the ROM in the figures is determined by mask patterns of the diffused source and drain layers 5, 6 and the contacts 7 of the output lines 8 with the drains 6.

As is illustrated in the pattern diagram of FIG. 2A, the ROM of the lateral system has the problem that the density of integration in the MIS large-scale integrated circuit (LSI) is decreased for the following reasons:

(1) Ground interconnection layers 4 for commonly grounding the source regions of the MISFETs are required for the respective columns.

(2) Since the contact windows are formed on the drain regions 6 of the respective MISFETs, the drain regions 6 and the Al interconnection layers 8 must be formed into large areas in consideration of mask misregistration.

SUMMARY OF THE INVENTION

It is, accordingly, a first object of the invention to reduce the power dissipation in an ROM for a decoder in which the number of output lines not to be selected is larger than the number of output lines to be selected.

A second object of the invention is to provide an ROM of a memory matrix which does not cause an increase in the number of components in the case of connecting the memory matrix and an address decoder formed by a novel ROM system.

A third object of the invention is to provide an ROM which reduces the power dissipation and, in addition, does not lower the density of integration.

A fourth object of the invention is to provide, in a memory matrix and an address decoder which are formed of a novel ROM system, a construction and a driving method for an address decoder and a memory matrix capable of increasing the read-out speed of the stored contents of the memory matrix without lowering the density of integration of the memory matrix.

The fundamental construction of this invention is characterized in that a plurality of MISFETs are connected in series in any desired pattern in a row between respective output lines disposed in a column and a reference voltage terminal. Hereunder, such an ROM is termed the "ROM of the longitudinal system."

DETAILED DESCRIPTION

Figure 3:
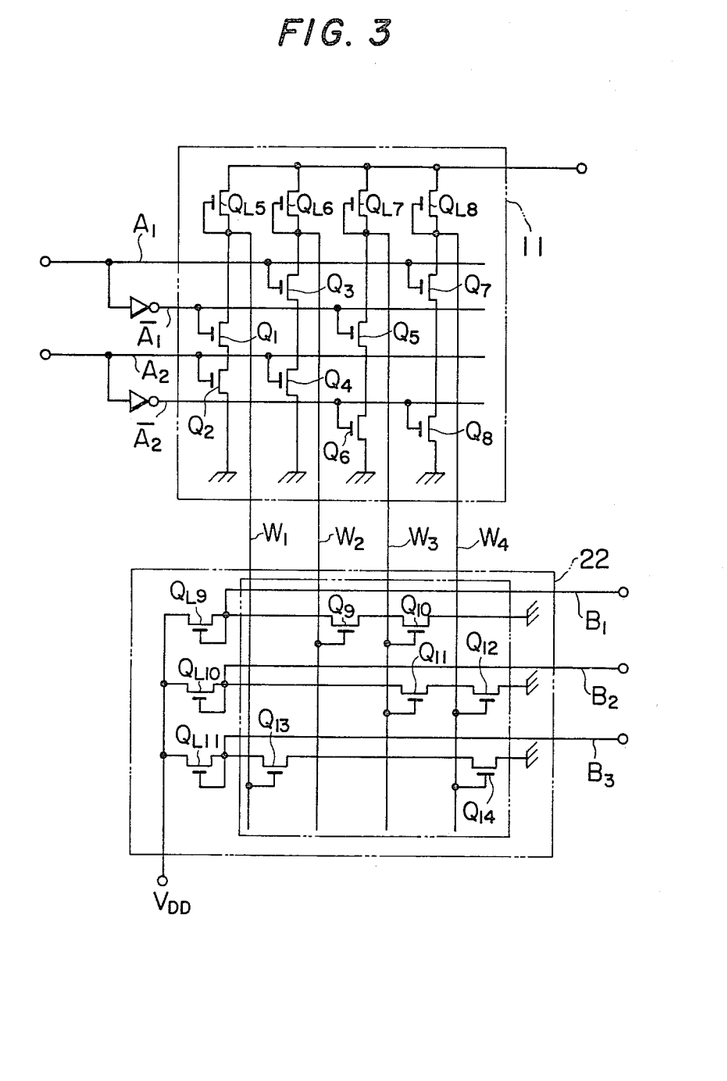
FIG. 3 is a circuit diagram which shows a word address decoder ROM and a memory matrix ROM formed by the longitudinal system of the invention.

FIG. 3 shows a word address decoder ROM 11 which is formed by the longitudinal system of the invention. In the word address decoder ROM 11 enhancement type MISFETs $Q_1$-$Q_8$ are disposed in any desired pattern in a matrix of rows and columns. The MISFETs disposed in a column are connected in series between a corresponding one of depletion type load MISFETs $Q_{L5}$-$Q_{L8}$ and the ground. The gates of the MISFETs disposed in a row are connected to a corresponding one of the address input lines $A_1$, $\overline{A}_1$, $A_2$ and $\overline{A}_2$ disposed in the respective rows. A logical circuit, which consists of each load MISFET and the plurality of MISFETs, is of the ratio type, and a corresponding one of the word address select lines $W_1$-$W_4$ is connected to the output thereof. The expression "ratio type" means a circuit whose output level is determined by the resistance ratio between the load MISFET and the driving MISFET. In such a longitudinal type ROM, all the MISFETs connected to unselected input lines turn "on" and the MISFETs connected to selected input lines turn "off", so that information as to whether or not MISFETs are connected with the selected input lines are derived from the output lines.

Here, the operation of the word address decoder ROM will be concretely explained by taking as an example a case where the word address select line $W_1$ is selected.

When an address signal representing a logical "O" (supply voltage $V_{DD}$) is applied to the address input lines $\overline{A}_1$ and $A_2$, both the MISFETs $Q_1$ and $Q_2$ turn "on", so that a d.c. path is established for the load MISFET $Q_{L5}$. Regarding the other load MISFETs $Q_{L6}$-$Q_{L8}$, at least one of the MISFETs connected to the particular column turns "off", and no d.c. path is therefore established. As a result, ground potential occurs in only the word address select line $W_1$, and this line is selected. With the longitudinal type address decoder ROM 11, even when the memory capacity of a memory matrix ROM increases, there is only one word address select line selected and only the word address select lines not to be selected increase.

Here, in order that information of only one column or only one word of the memory matrix ROM 2 of the hitherto known lateral system shown in FIG. 1 may be selected by the use of the word address decoder ROM 11 of the longitudinal system, inverters must be incorporated into the respective word address select lines $W_1$-$W_4$. The reason therefor is that the address decoder ROM 11 operates under the conditions under which the selected word address select line is at ground potential and the unselected word address select lines is at the supply voltage, whereas the memory matrix ROM 2 operates under the conditions under which the selected word address select line is at the supply voltage and the unselected word address select lines is at ground potential. Thus, where the memory matrix ROM 2 is decoded by the address decoder ROM 11, there is an increase in the number of extra components.

In FIG. 3, there is shown a memory matrix ROM which is also formed by the longitudinal system in order to solve the above problem.

In the memory matrix ROM 22, MISFETs $Q_9$-$Q_{14}$ of the enhancement type are disposed in a desired pattern in rows and columns. The MISFETs in each row are connected in series between corresponding load MISFETs of the depletion type $Q_{L9}$-$Q_{L11}$ and ground. The gates of the MISFETs in each row are connected to corresponding word address select lines $W_1$-$W_4$ in the respective columns. At one end of each of the load MISFETs $Q_{L9}$-$Q_{L11}$, there is connected a corresponding one of the bit output lines $B_1$-$B_3$. That portion in each row in which no MISFET exists is a mere interconnection part, viz., it is short-circuited by extending a $P^+$-region.

In the memory matrix ROM 22, all the MISFETs connected to non-selected word address select lines are turned "on", so that information as to whether or not MISFETs are connected with the selected word address select line is supplied to the bit output lines $B_1$-$B_3$.

Now, an example in which the fixed stored contents of the column selected by the word address select line $W_1$ are read out will be explained.

When ground potential is applied from the selected word address select line $W_1$ and the supply voltage from the non-selected word address select lines $W_2$-$W_4$, the MISFET $Q_{13}$ turns "off" and the MISFETs $Q_9$-$Q_{12}$ and $Q_{14}$ turn "on". Thus, for the load MISFET $Q_{L9}$, a d.c. path is established because no MISFET exists in the selected column and the MISFETs $Q_9$ and $Q_{12}$ are "on". For the load MISFET $Q_{L10}$ a d.c. path is established because no MISFET exists in the selected column and the MISFETs $Q_{11}$ and $Q_{12}$ are "on". For the load MISFET $Q_{L11}$, a d.c. path is not established because the MISFET $Q_{13}$ in the selected column is turned "off". As a consequence, ground potential is supplied to the bit output line $B_1$ and to the bit output line $B_2$, and the supply voltage is supplied to the bit output line $B_3$ as the respective fixed stored contents.

As is set forth above, the memory matrix ROM 22 according to the longitudinal system operates under the conditions under which a selected word address select line is at ground potential and a non-selected word address select line is at the supply voltage. At its connection with the word address decoder ROM 11 of the longitudinal system, therefore, it can be directly connected without the necessity for interposing inverters.

Figure 4:
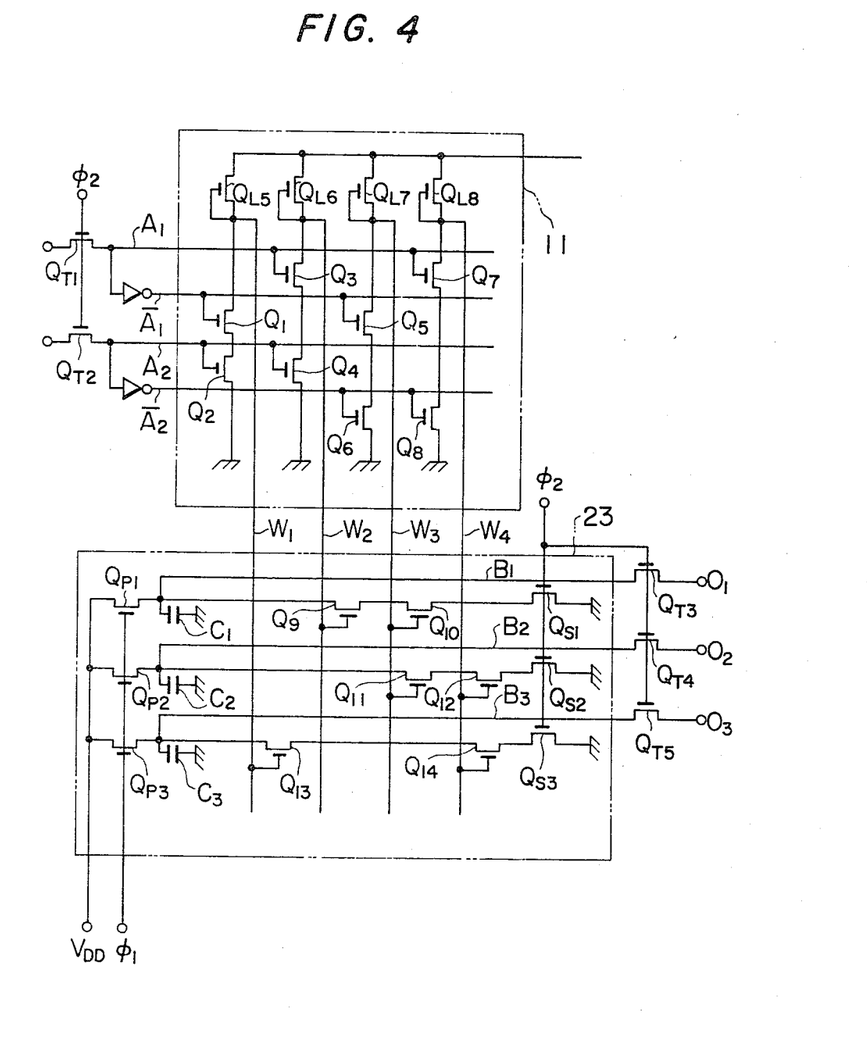
FIG. 4 shows a circuit diagram in the case of forming a memory matrix ROM by the ratioless type in which no d.c. path is established, and a circuit diagram of a longitudinal word address decoder ROM.

FIG. 4 shows a circuit arrangement in which a memory matrix ROM 23 is the ratioless type, in order to improve the density of integration and the power dissipation of the memory matrix ROM 22 of FIG. 3. The expression "ratioless type" shall mean a circuit whose output potential is not determined by the resistance ratio between the load MISFET and the driving MISFET.

Figure 5A:
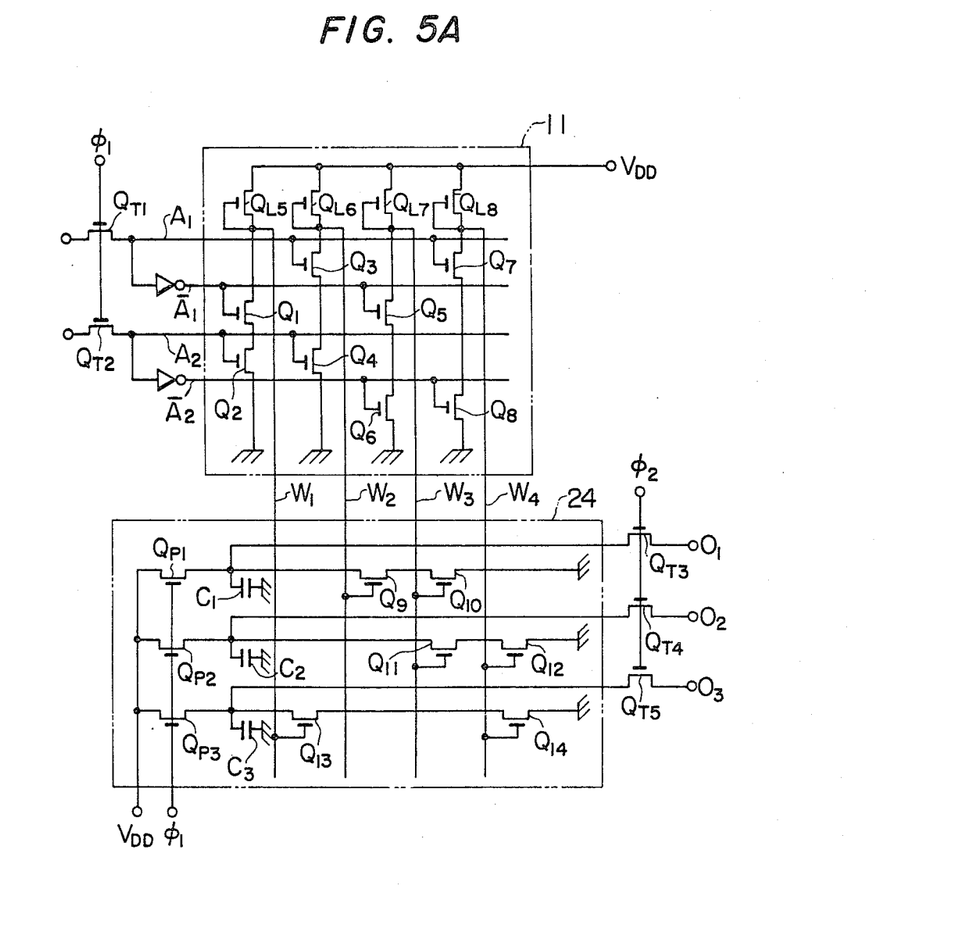
FIG. 5A is a circuit diagram of a word address decoder ROM of the longitudinal system and a ratioless type longitudinal memory matrix ROM with sampling MISFETs removed.
Figure 5B:
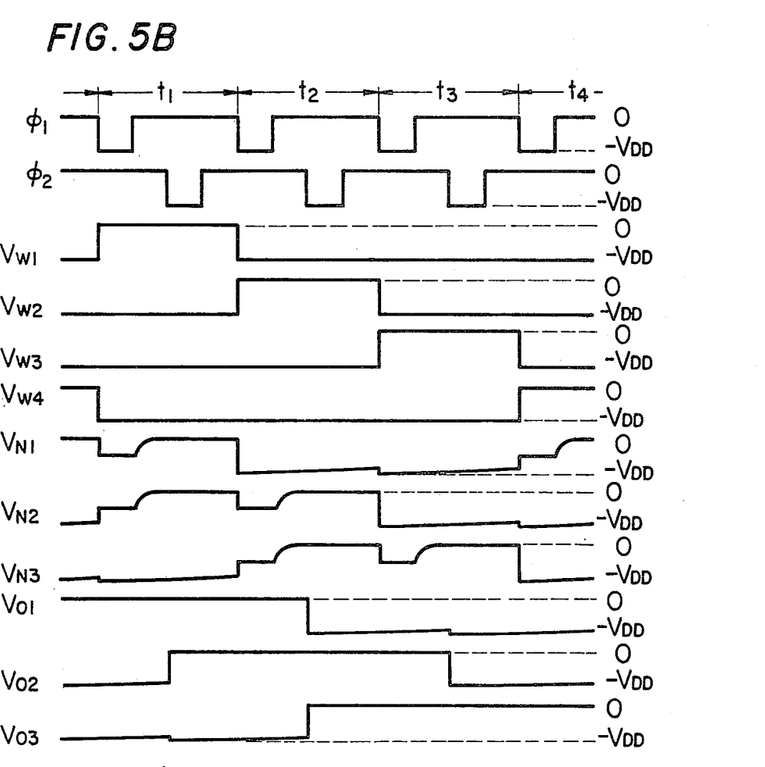
FIG. 5B shows discharge characteristics of the memory matrix ROM in FIG. 5A.

Referring to the figure, $Q_{P1}$-$Q_{P3}$ are MISFETs for precharging, which are driven by a clock pulse $\phi_1$ illustrated in FIG. 5B. $C_1$-$C_3$ denote capacitors. P-N junction capacitors are employed as the capacitors $C_1$-$C_3$, respectively. $Q_{S1}$-$Q_{S3}$ designate MISFETs for sampling, which are driven by a clock pulse $\phi_2$ illustrated in FIG. 5B. $Q_{T1}$-$Q_{T5}$ designate transfer gate MISFETs, which are driven by the clock pulse $\phi_2$. $0_1$-$0_3$ designate outputs, respectively.

At the timing of the clock pulse $\phi_1$, charges are supplied from a power source $V_{DD}$ through the precharging MISFETs $Q_{P1}$-$Q_{P3}$ to the capacitors $C_1$-$C_3$. Subsequently, at the timing of the clock pulse $\phi_2$, an address signal is applied to the word address decoder ROM 11 through the transfer MISFETs $Q_{T1}$ and $Q_{T2}$. In that case, any optional word address select line is immediately selected because the word address decoder ROM 11 is the ratio type. The MISFET of the column selected by the word address decoder ROM 11 turns "off", whereas the MISFETs of the columns not selected are turned "on". At the timing of the clock pulse $\phi_2$, the sampling MISFETs $Q_{S1}$-$Q_{S3}$ also turn "on". Thus, in the row in which no MISFET exists in the selected column, the charges in the capacitor connected to the particular row are discharged through the sampling MISFET, whereas in the row in which the MISFET exists in the selected column, the charges in the capacitor connected to the particular row are not discharged. The voltage states of the capacitors $C_1$-$C_3$ are respectively read out through the transfer MISFETs $Q_{T3}$-$Q_{T5}$ to the output terminals $0_1$-$0_3$ as information of the fixed stored contents of the selected column.

As explained above, according to the memory matrix ROM of FIG. 4, the following advantages are achieved;

(1) Since the fixed stored contents to be supplied to the respective bit output lines are determined in dependence on whether the charges in the capacitors connected to the respective rows are discharged or not, it is practically unnecessary to consider the $g_m$ (mutual conductance) ratio between the precharging MISFETs and the MISFETs connected thereto. That is, the $g_m$ between the sampling MISFETs and the MISFETs connected thereto can be made small and, accordingly, the occupying areas of the respective MISFETs can be made small, with the result that the density of integration of the memory matrix ROM 23 is enhanced.

(2) The clock pulses $\phi_1$ and $\phi_2$ are completely different in phase; in other words, the precharging MISFETs and the sampling MISFETs are never turned "on" at the same time, so that practically no d.c. path is established between the power source ($V_{DD}$) and ground. Consequently, power dissipation in the memory matrix 23 is sharply reduced.

On the other hand, the memory matrix ROM 23 shown in FIG. 4 does not always have a high read-out speed for the fixed stored contents of the memory matrix ROM 23 and it can be improved, for the following reasons:

(1) The charges are accumulated in the capacitor $C_1$-$C_3$ by the clock pulse $\phi_1$, and they are not discharged until the clock pulse $\phi_2$ is impressed.

(2) Since the time constant which is determined by the comprehensive "on" resistance of the plurality of MISFETs in each row and the capacity is large, the discharging time is long. In other words, the width of the clock pulse $\phi_2$ must be made large.

FIG. 5A shows a ratio type longitudinal word address decoder ROM 11 and a ratioless type longitudinal memory matrix ROM 24 with the sampling MISFETs removed, on which an address signal is impressed by the clock pulse $\phi_1$ in order to shorten the discharging time, etc. of the memory matrix ROM 23 in FIG. 4 and to thus increase the read-out speed. The operation of the memory matrix ROM 24 will now be described where the word address select line $W_1$ is selected (zero V) and where the lines $W_2$-$W_4$ are unselected ($-V_{DD}$).

First, the clock pulse $\phi_1$ drops to a negative potential, and the precharging MISFETs $Q_{P1}$-$Q_{P3}$ are turned "on". Then, the capacitor $C_3$ is charged to the potential $V_{DD}$ because the MISFET $Q_{13}$ is "off". On the other hand, the capacitors $C_1$ and $C_2$ are charged only to values resulting from multiplying the supply voltage $V_{DD}$ by the ratios of the mutual conductances between the precharging MISFETs $Q_{P1}$ and $Q_{P2}$ and the data input MISFETs $Q_9$, $Q_{10}$ and $Q_{11}$, $Q_{12}$ because all the MISFETs connected in series with the respective output lines are "on". Subsequently, when the clock pulse $\phi_1$ reaches ground potential, the charges stored in the capacitors $C_1$ and $C_2$ begin to discharge at once. Thereafter, the potentials of the respective output lines reach ground potential. In contrast, the charge stored in the capacitor $C_3$ is not discharged since the MISFET $Q_{13}$ is still "off", and the potential of the output line is maintained substantially at the potential $V_{DD}$. Subsequently, when the clock pulse $\phi_2$ becomes a negative potential, the transfer gate MISFETs $Q_{T3}$-$Q_{T5}$ turn "on", and the potentials of the output lines appear as 0 (zero) V, 0 (zero) V and $V_{DD}$ at the output terminals $0_1$, $0_2$ and $0_3$, respectively.

FIG. 5B shows the operational waveforms of the memory matrix ROM 24 in FIG. 5A. By reference to the operational waveforms, enhancement of the read-out speed in FIG. 5A will become more evident. In FIG. 5B, $\phi_1$ and $\phi_2$ designate the clock pulses, which differ in phase from each other. $V_{W1}$-$V_{W4}$ illustrate the voltage states of the word address select lines $W_1$-$W_4$, $V_{N1}$-$V_{N3}$ illustrate the voltage states of the capacitors $C_1$-$C_3$, and $V_{01}$-$V_{03}$ illustrate the voltage states of the output terminals $0_1$-$0_3$.

Numerals $t_1$, $t_2$, $t_3$ and $t_4$ indicate the operational waveforms of $V_{W1}$-$V_{W4}$, $V_{N1}$-$V_{N3}$ and $V_{01}$-$V_{03}$ in the cases where the fixed stored contents of the column selected by the word address select line $W_1$ are read out, where those of the column selected by the word address select line $W_2$ are read out, where those of the column selected by the word address select line $W_3$ are read out, and where those of the column selected by the word address select line $W_4$ are read out, respectively.

As is apparent from the above description of operation, the memory matrix ROM 24 in FIG. 5A has an improved discharging operation and, accordingly, a faster read-out speed with respect to the embodiment in FIG. 4, for the following reasons:

(1) Since the sampling MISFETs are removed, the number of the MISFETs to be connected with each output line is decreased by one. Consequently, the discharge time constants of the capacitors $C_1$-$C_3$ are diminished, and the discharging periods of time are shortened.

(2) The capacitor as to which the potential of the corresponding output line is to be determined to 0 (zero) V is charged to a voltage smaller (absolute value) than the supply voltage $V_{DD}$ when the clock pulse $\phi_1$ comes to the negative potential. Therefore, the discharging period of time becomes shorter by the difference.

(3) When the clock pulse $\phi_1$ is at ground potential, the point of time at which the charges stored in the capacitors $C_1$–$C_3$ begin to be discharged is shortened.

Figure 6A:
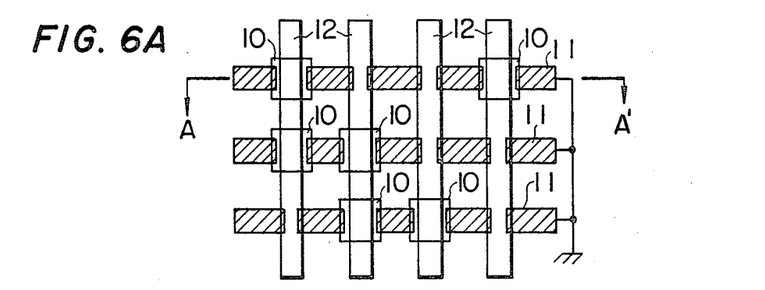
FIG. 6A shows a pattern diagram where a part of the memory matrix ROM in FIG. 3 as indicated by one-dot chain lines is assembled in an MISLSI.
Figure 6B:
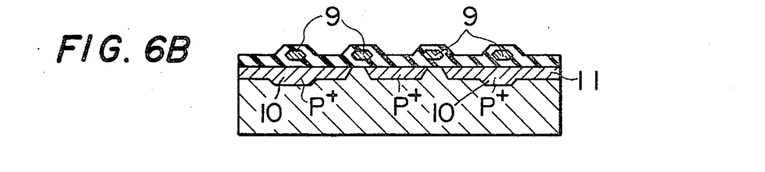
FIG. 6B is a front sectional view taken along A-A' in FIG. 6A.

FIG. 6A shows a pattern diagram in the case where the memory matrix portion 22 in FIG. 3 is assembled in a single semiconductor chip. FIG. 6B is a sectional view taken along A–A' in FIG. 6A. In FIG. 6A, the writing pattern of the longitudinal type ROM is formed by the presence or absence of a buried region underneath a Si gate layer. In other words, a part at which the buried region exists underneath the Si gate layer is merely made an interconnection portion and hence practically no MISFET exists thereat, whereas a part at which the buried region does not exist underneath the Si gate layer is formed with source and drain regions isolated from each other and hence a MISFET exists thereat.

Description will now be made of the pattern of the longitudinal type ROM. In the figure, numeral 9 indicates a Si gate layer (corresponding to the word address select line) for forming the gate portions of the MISFETs in each column and for commonly connecting the gates. Numeral 10 indicates the buried region formed by the P+-diffusion at the part at which the mere interconnection portion is desired without the existence of the MISFET. Since the buried region 10 lies directly beneath the Si gate, it is formed before forming the Si gate layer 9. Numeral 11 denotes a P+-interconnection layer, which forms the drain regions and source regions of the MISFETs disposed in each row and which is used to connect in series the MISFETs in the particular row. At parts at which the buried regions 10 are not formed directly beneath the Si gate layers 9, the gate parts of the respective MISFETs are formed.

As explained above, where the ROM of the longitudinal system is assembled in an MISLSI, the following merits are attained:

(1) In order to write the pattern of the ROM in each row, the MISFETs may be connected in series by the P+-interconnection portion. It is not necessary to form the contact windows for the connection of the word address select lines in the respective drain regions as required in case of a lateral ROM. It is, consequently, unnecessary to provide the contact regions in the drain regions, so that the occupying area can be made small.

(2) The ground interconnection layer need not be provided in each column as needed in the pattern of the lateral ROM, and may practically be one. (refer to FIG. 5A).

(3) Since, with the longitudinal type ROM, the MISFETs are formed by the two-layer interconnections of the Si gate layer and the P+-interconnection layer, an Al interconnection layer can be formed on the longitudinal type ROM-forming area as the third layer. Where, as in the lateral type ROM, the MISFETs are formed by the three layers of the Si gate layer, the P+-interconnection layer and the Al interconnection layer serving as the output line, it is difficult to form a further interconnection portion on the ROM-forming area, and it has been necessary to especially form an area for the interconnection portion outside the ROM-forming area.

As thus far explained, according to the embodiments of this invention, the first to fourth objects can be respectively accomplished for the following reasons:

(1) The address decoder ROM 11 shown in FIG. 3 is formed of a longitudinal system, so that current flows through the load MISFET connected with the selected address select line, whereas no current flows through the load MISFET connected with the unselected address select line. In the address decoder ROM, the number of address select lines to be selected is smaller than the number of address select lines not to be selected. Accordingly, the power dissipated in the address decoder ROM of the longitudinal system is sharply reduced.

(2) The address decoder ROM of the longitudinal system decodes an address signal in such a manner that the selected address select line is at ground potential and the unselected address select line is at the potential of the supply voltage. Also, the memory matrix ROM of the longitudinal system operates in such a manner that the MISFETs of the selected column turn "off" and that the MISFETs of the unselected column turn "on". This signifies that, in connecting the address decoder ROM with the memory matrix ROM, they can be directly connected without interposing inverters between their output and input.

(3) The memory matrix ROM 23 is not of the ratio type in which the output voltage is produced in dependence on the resistance ratio ($g_m$ ratio) between the load MISFET and the driving MISFET, but it is of the ratioless type in which the output voltage is determined in dependence on whether the charges accumulated in the capacitor are discharged or not. It is, therefore, unnecessary to consider the $g_m$ of the MISFETs which are connected to the precharging MISFET. As a consequence, the lowering of the density of integration does not occur. Further, the ratioless type is adapted to accumulate charges in the capacitor by the clock pulse $\phi_1$ and to discharge the capacitor by the clock pulse $\phi_2$, so that practically no d.c. path is established between the power source and ground. As a consequence, the reduction of power dissipation can also be attained.

(4) The ratio type longitudinal word address decoder ROM 11 and the ratioless type longitudinal memory matrix ROM 24 are formed with the sampling MISFETs removed; the address signal is impressed on the word address decoder ROM 11 by the clock pulse $\phi_1$, while the memory matrix ROM 24 is precharged in synchronism therewith; and the fixed stored contents are thereafter read out by the clock pulse $\phi_2$. Owing to such construction, the read-out speed for the fixed stored contents is sharply enhanced on the following grounds:

(1) In the row in which the selected column has no MISFET, charges are accumulated in the capacitor connected with the particular row at the resistance ratio between the precharging MISFET and the MISFETs connected therewith. Thus, the charges are not accumulated up to the supply voltage.

(2) Since the sampling MISFETs are removed, the discharge initiates as soon as the clock pulse $\phi_1$ terminates.

(3) The discharge at that time is faster owing to the fact that the time constant is smaller by the component of the absence of the sampling MISFET.

Figure 7:
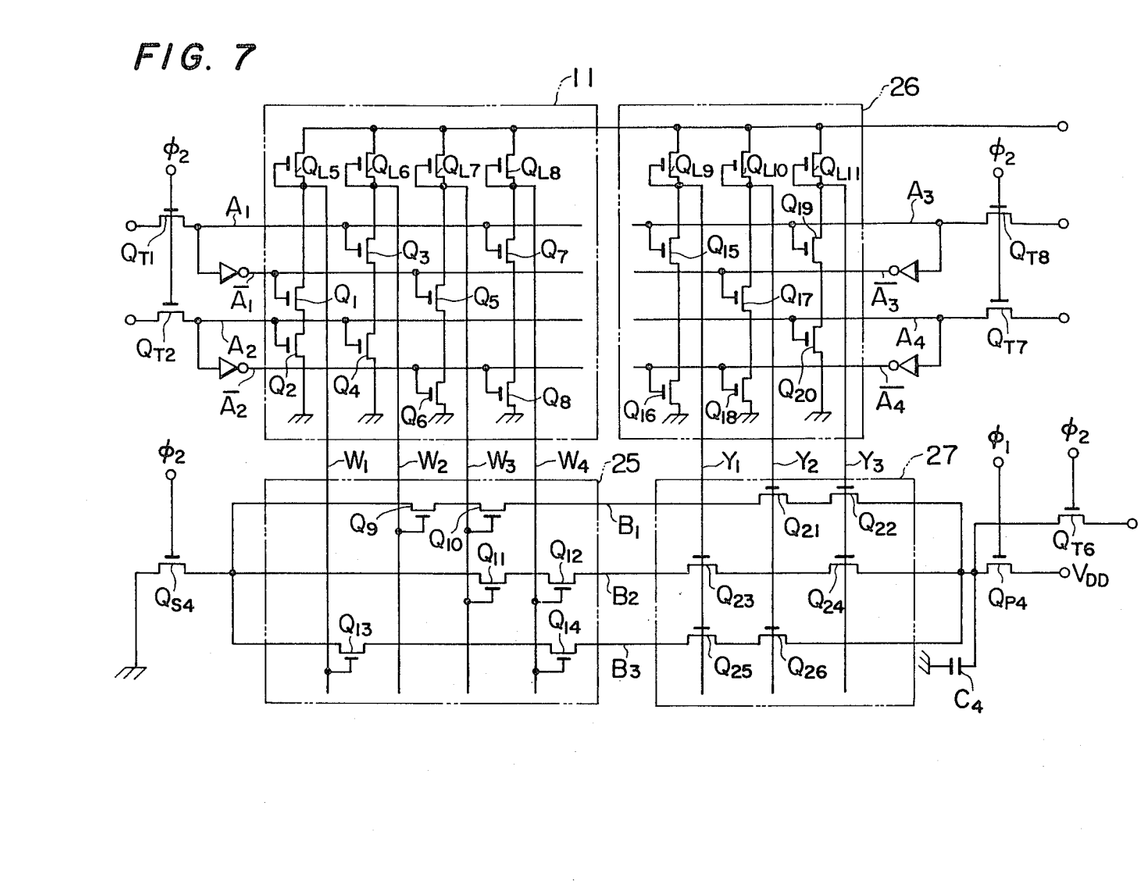
FIGS. 7 and 8 show further embodiments of the invention.
Figure 8:
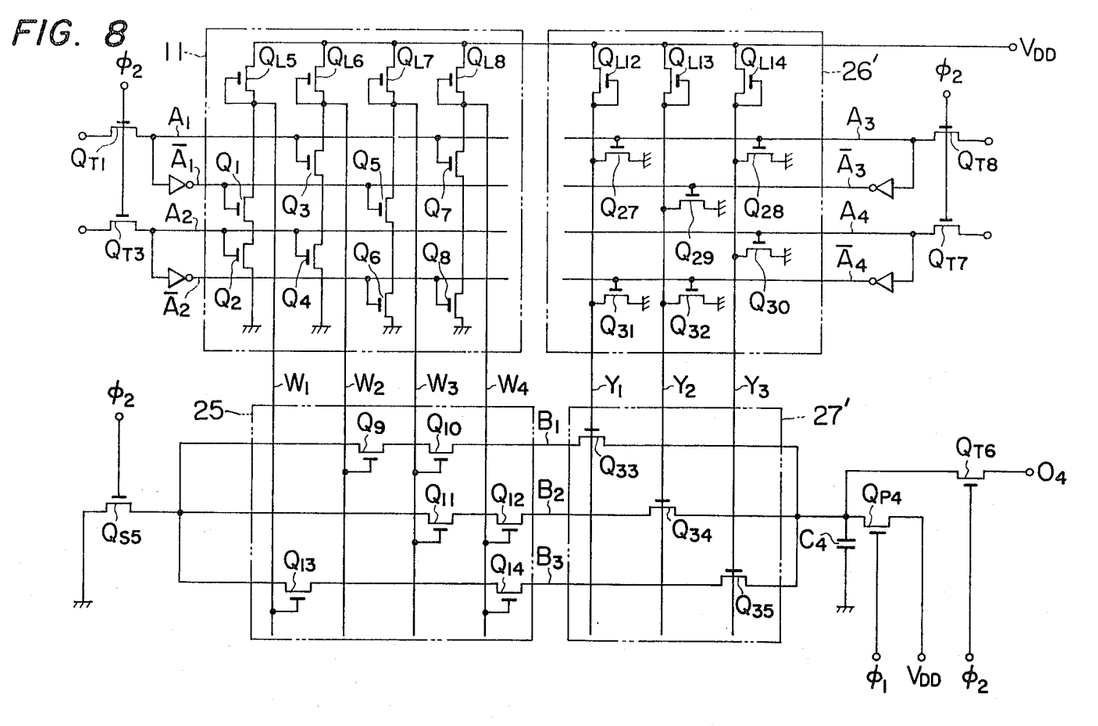

While the various embodiments of this invention have been explained above, the invention covers further aspects of performance shown in FIGS. 7 and 8.

In the further embodiment of this invention as illustrated in FIG. 7, in order that any desired row of the memory matrix ROM may also be selected, a memory matrix ROM portion 25 and the word address decoder ROM 11 are additionally provided with a bit address decoder ROM 26 and a bit select ROM portion 27.

The bit select ROM portion 27 is a gate circuit for selecting one of a plurality of bit output lines $B_1$–$B_3$, and it is formed of a longitudinal ROM integral with the memory matrix ROM portion 25. The bit address decoder ROM 26 serves to arbitrarily control the bit select ROM portion 27.

Here, the operation of the bit select ROM portion 27 will be explained by taking a case of selecting the bit output line $B_1$ as an example.

When a bit address select line $Y_1$ is selected by the bit address decoder ROM 26, MISFETs $Q_{23}$ and $Q_{25}$ of the bit select ROM portion 27 are turned "off". MISFETs $Q_{21}$ and $Q_{22}$ respectively connected with bit address select lines $Y_2$ and $Y_3$ turn "on" because the supply voltage is applied thereto. The bit output line $B_1$ is connected to one terminal of a capacitor $C_4$ as the MISFETS $Q_{21}$ and $Q_{22}$ turn "on", whereas the bit output lines $B_2$ and $B_3$ are not connected to the one end of the capacitor $C_4$ as the MISFETs $Q_{23}$ and $Q_{25}$ are "off". In this manner, the predetermined address of the memory matrix ROM portion 25 can be selected by the word address decoder ROM and the bit address decoder ROM.

In the further embodiment of this invention as illustrated in FIG. 8, the bit address decoder ROM is built up by a ROM of the lateral system, whereby a single MISFET is disposed in each row of the bit select ROM portion. Referring to the figure, the bit select ROM portion 27' has a MISFET $Q_{33}$ arranged at a part of the intersection between the bit address select line $Y_1$ and the bit output line $B_1$, a MISFET $Q_{34}$ arranged at a part of the intersection between the bit address select line $Y_2$ and the bit output line $B_2$, and a MISFET $Q_{35}$ arranged at a part of the intersection between the bit address select line $Y_3$ and the bit output line $B_3$. According to this construction, only the bit select line which has the MISFET at the part of the intersection with the bit address select line selected by the bit address decoder ROM 26' is connected to the capacitor $C_4$.

In accordance with the further embodiment of FIG. 8, the single MISFET is disposed in each row of the bit select ROM, and hence, where the memory matrix portion and the bit select portion are formed of an integral longitudinal ROM, there is attained the disadvantage that the discharge characteristic is not hindered.

According to the various embodiments and the further embodiments of this invention as explained above, the following effects are acquired:

(1) According to the address decoder ROM 11 shown in FIG. 3, power dissipation can be suppressed to be lower than in the address decoder ROM of the lateral system.

(2) According to the address decoder ROM 11 and the memory matrix ROM 22 shown in FIG. 3, the number of components does not increase in connecting them.

(3) According to the memory matrix ROM 23 shown in FIG. 4, power dissipation is sharply reduced because the ROM is built up by the ratioless type in which no d.c. path is established.

(4) According to the construction of, and the driving method for, the word address decoder ROM 11 and the memory matrix ROM 24 in FIG. 5A, the speed of reading out the fixed stored contents is enhanced.

(5) In FIG. 8, the single MISFET suffices for each row of the bit select ROM portion, so that the discharge characteristic of the longitudinal ROM composed of the memory matrix ROM portion 25 and the bit select ROM portion 26' is improved.

(6) Where the longitudinal ROM is assembled in the form of an MISLSI, the density of integration can be sharply raised owing to the pattern shown in FIG. 6. Also, in case where the longitudinal ROM is formed of the ratioless type, $g_m$ need not be considered, and hence, the density of integration is more enhanced.

I claim:

1. A semiconductor read only memory including
a first decoder circuit comprising:
    a plurality of input lines;
    a plurality of output lines;
    a first reference potential terminal to which a first source of reference potential is applied;
    a plurality of load elements connected between respective ones of said output lines and said first reference potential terminal;
    a second reference potential terminal to which a second source of reference potential is applied; and
    plural groups of switching elements connected in series between respective ones of said load elements and said second reference potential terminal, the switching elements of each group having control inputs selectively connected to said input lines in accordance with a prescribed code pattern, so that the number of output lines to be selected in response to address signals applied to said input lines is less than the number of output lines not selected; and further including
a second decoder circuit comprising
    a plurality of input lines respectively connected to the output lines of said first decoder circuit;
    a plurality of output lines;
    a controlled switching circuit connected to said second reference potential terminal; and
    plural groups of switching elements connected in series between said controlled switching circuit and the respective output lines of said second decoder circuit, the switching elements of each group having control inputs selectively connected to the input lines of said second decoder circuit in accordance with a predetermined code pattern;
a third decoder circuit comprising
    a plurality of input lines;
    a plurality of output lines;
    a plurality of load elements connected between respective ones of the output lines of said third decoder circuit and said first reference potential terminal; and
    plural groups of switching elements connected in series between respective ones of the load elements of said third decoder circuit and said second reference potential terminal, the switching elements of each group having control inputs selectively connected to the input lines of said third decoder circuit in accordance with a pre-established code pattern;
a fourth decoder circuit comprising
    a plurality of input lines respectively connected to the output lines of said third decoder circuit;
    a plurality of output lines;
    a controlled charge storage circuit connected between each of the output lines and said fourth decoder circuit and said first reference potential terminal; and plural groups of switching elements conncted in series between the output lines of said second and fourth decoder circuits, the switching elements of each group having control inputs selectively connected to the output lines of said third decoder circuit in accordance with a selected code pattern;

means for applying address signals to the input lines of said first and third decoder circuits and for controlling the controlled switching circuit of said second decoder circuit in accordance with a first clock signal;

means for applying a second clock signal, shifted in phase relative to said first clock signal, to the controlled charge storage circuit of said fourth decoder circuit, and wherein said load and switching elements are such that current flows through a load element only if said load element is connected to a selected output line.

2. A semiconductor read only memory according to claim 1, wherein the code patterns of said first and second decoder circuits correspond to word code patterns, while the code patterns of said third and fourth decoder circuits correspond to bit code patterns.

3. A semiconductor read only memory according to claim 2, wherein said fourth decoder circuit further comprises a controlled transfer gate circuit connected to each of the output lines of said fourth decoder circuit and being controlled by said first clock signal for reading out the contents of said fourth decoder circuit.

4. A semiconductor read only memory including
a first decoder circuit comprising:
   a plurality of input lines;
   a plurality of output lines;
   a first reference potential terminal to which a first source of reference potential is applied;
   a plurality of load elements connected between respective ones of said output lines and said first reference potential terminal;
   a second reference potential terminal to which a second source of reference potential is applied; and
   plural groups of switching elements connected in series between respective ones of said load elements and said second reference potential terminal, the switching elements of each group having control inputs selectively connected to said input lines in accordance with a prescribed code pattern, so that the number of output line to be selected in response to address signals applied to said input lines is less than the number of output lines not selected; and further including
a second decoder circuit comprising
   a plurality of input lines respectively connected to the output lines of said first decoder circuit;
   a plurality of output lines;
   a controlled switching circuit connected to said second reference potential terminal; and
   plural groups of switching elements connected in series between said controlled switching circuit and the respective output lines of said second decoder circuit, the switching elements of each group having control inputs selectively connected to the input lines of said second decoder circuit, in accordance with a predetermined code pattern;
a third decoder circuit comprising
   a plurality of input lines;
   a plurality of output lines;
   a plurality of load elements connected between respective ones of the output lines of said third decoder circuit and said first reference potential terminal; and
   plural groups of switching elements connected in parallel between respective ones of the load elements of said third decoder circuit and said second reference potential terminal, the switching elements of each group having control inputs selectively connected to the input lines of said third decoder circuit in accordance with a pre-established code pattern;
a fourth decoder circuit comprising
   a plurality of input lines respectively connected to the output lines of said third decoder circuit;
   a plurality of output lines;
   a controlled charge storage circuit connected between each of the output lines of said fourth decoder circuit and said first reference potential terminal; and
   plural groups of switching elements connected in series between the output lines of said second and fourth decoder circuits, the switching elements of each group having control inputs selectively connected to the output lines of said third decoder circuit in accordance with a selected code pattern;
   means for applying address signals to the input lines of said first and third decoder circuits and for controlling the controlled switching circuit of said second decoder circuit in accordance with a first clock signal;
   means for applying a second clock signal, shifted in phase relative to said first clock signal, to the controlled charge storage circuit of said fourth circuit; and
   wherein said load and switching elements are such that current flows through a load element only if said load element is connected to a selected output line.

5. A semiconductor read only memory according to claim 4, wherein the code patterns of said first and second decoder circuits correspond to word code patterns, while the code patterns of said third and fourth decoder circuits correspond to bit code patterns.

6. A semiconductor read only memory according to claim 5, wherein said fourth decoder circuit further comprises a controlled transfer gate circuit connected to each of the output line of said fourth decoder circuit and being controlled by said first clock signal for reading out the contents of said fourth decoder circuit.

7. A semiconductor read only memory including:
   a read only memory matrix portion for storing a prescribed code pattern comprising a plurality of first address lines for applying a first address signal, and plural first series connections each including a plurality of first insulated gate field effect transistors connected in series with each other, one ends of the first series connections being coupled in common to a reference potential source, said first insulated gate field effect transistors of each first series connection having gate electrodes selectively connected to said first address lines in accordance with the prescribed code pattern; and
   a selecting matrix portion for connecting a selected one of said first series connections to a common output terminal comprising a plurality of second address lines for applying a second address signal, and plural second series connections, each including a plurality of second insulated gate field effect transistors connected in series with each other, connected between respective ones of the other ends of said first series connections and said common output terminal, the insulated gate field effect transistors of each second series connection having gate electrodes selectively connected to said second address lines in such manner that only one of said second series connection is allowed to form a conduction path between said common output terminal and a selected one of the other ends of the first series connections by said second address signal supplied to the gate electrodes therein.

8. A semiconductor read only memory according to claim 7, further comprising an output capacitor coupled between said common output terminal and the reference potential source; a third insulated gate field effect transistor having a gate electrode driven by a first clock pulse signal connected between said common output terminal and a power source for precharging said output capacitor; and output deriving means for deriving an output signal appearing at said common output terminal, whereby said read only memory matrix portion is operative in a ratioless mode in cooperation with the third insulated gate field effect transistor.

9. A semiconductor read only memory according to claim 8, wherein said output deriving means comprises a fourth insulated gate field effect transistor connected between said one ends of the first series connections and the reference potential source to connect in common said one ends of the first series connections to the reference potential source therethrough; and a fifth insulated gate field effect transistor connected to said common output terminal to derive the output signal from the common output terminal, each of said fourth and fifth insulated gate field effect transistors having a gate electrode driven by a second clock pulse signal being out of phase with said first clock pulse signal.

10. A semiconductor read only memory including:
a read only memory matrix portion for storing a prescribed code pattern comprising a plurality of first address lines for applying a first address signal, and plural series connections each including a plurality of first insulated gate field effect transistors connected in series with each other, one ends of the series connections being coupled in common to a reference potential source, said first insulated gate field effect transistors of each series connection having gate electrodes selectively connected to said first address lines in accordance with the prescribed code pattern; and
a selecting matrix portion for connecting a selected one of said series connections to a common output terminal comprising a plurality of second address lines for applying a second address signal, and plural second insulated gate field effect transistors being connected between respective ones of the other ends of said series connections and said common output terminal, the second insulated gate field effect transistors having respective gate electrodes connected to said corresponding second address lines to allow only one of said second insulated gate field effect transistors to form a conduction path between said common output terminal and a selected one of the other ends of said series connections by said second address signal supplied to the gate electrode thereof.

11. A semiconductor read only memory according to claim 10, further comprising an output capacitor coupled between said common output terminal and the reference potential source; a third insulated gate field effect transistor having a gate electrode driven by a first clock pulse signal connected between said common output terminal and a power source for precharging said output capacitor; and output deriving means for deriving an output signal appearing at said common output terminal, whereby said read only memory matrix portion is operative in a ratioless mode in cooperation with the third insulated gate field effect transistor.

12. A semiconductor read only memory according to claim 11, further comprising a fourth insulated gate field effect transistor connected between said reference potential source and said one ends of the series connections including the first insulated gate field effect transistors, said fourth insulated gate field effect transistor having a gate electrode driven by a second clock pulse signal.

13. A semiconductor read only memory according to claim 10, wherein each of the other ends of said series connections is connected to said common output terminal through said second insulated gate field effect transistors which are connected in series with each other.

14. A logic circuit comprising:
a plurality of field effect transistors being selectively arrayed along a plurality of rows and columns so that the transistors arrayed along the each row are connected in series with one another between a common output terminal and another common terminal;
a plurality of row address lines, for applying a row address signal in accordance with a row address code pattern, being arrayed along prescribed ones of said plural columns at any one of which said each row has at least one selection field effect transistor of said plural field effect transistors, respective ones of said plural row address lines being connected to the gates of said selection transistors at said respective rows in accordance with said row address code pattern so that said at least one selection field effect transistor at only one of said plural rows is allowed to become conductive in response to said row address signal; and
a plurality of column address lines, for applying a column address signal in accordance with a column address code pattern, being arrayed along the others of said plural columns at which said each row has the memory field effect transistors other than said at least one selection field effect transistor of said plural field effect transistors, respective ones of said plural column address lines being connected to the gates of said memory transistors in accordance with said column address code pattern to apply said column address signal.

15. A logic circuit comprising:
a plurality of field effect transistors being selectively arrayed along a plurality of rows and columns so that the transistors arrayed along the each row are connected in series with one another between a common output terminal and another common terminal;
a plurality of row address lines, for applying a row address signal in accordance with a row address code pattern, being arrayed along prescribed ones of said plural columns at any one of which said each row has at least one selection field effect transistor of said plural field effect transistors, respective ones of said plural row address lines being connected to the gates of said selection transistors at said respective rows in accordance with said row address code pattern so that said at least one selection field effect transistor at only one of said plural rows is allowed to become conductive in response to said row address signal; and a plurality of column address lines, for applying a column address signal in accordance with a column address code pattern, being arrayed along the others of said plural columns at which said each row has the memory field effect transistors other than said at least one selection field effect transistor of said plural field effect transistors, respective ones of said plural column address lines being connected to the gates of said memory transistors in accordance with said column address code pattern to apply said column address signal; and an address decoder having plural sets of true and complement address inputs and including a first decoder matrix and a second decoder matrix each comprising plural outputs and a plurality of transistors selectively arrayed along a plurality of rows and columns, one of first and second decoder matrixes being responsive to different sets of address inputs from the other, said outputs of said second decoder matrix being supplied to said row address lines and said outputs of said first decoder matrix being supplied to said column address lines.

16. A logic circuit according to claim 15, wherein each of said first and second decoder matrixes in which said transistors in each column are connected in series.

17. A logic circuit according to claim 16, wherein all of said transistors in said first and second matrices are MISFETs, said first and second decoder matrices each being operative in a ratio mode, so that each output level thereof depends on a ratio between a load transistor and driving transistors, and said memory transistors are operative in a ratioless mode so that the output level thereof does not depend on a ratio between a load transistor and driving transistors.

18. A logic circuit according to claim 17, wherein said load transistors in said first and second decoder matrixes are depletion mode MISFETs each gate of which is connected to it's source.

19. A logic circuit according to claim 15, wherein in said first decoder matrix the transistors in each column are connected in series and in said second decoder matrix the transistors in each column are connected in parallel.

20. A logic circuit according to claim 19, wherein all of said transistors in said first and second decoder matrices are MISFETs, said first and second decoder matrices each being operative in a ratio mode so that each output level thereof depends on a ratio between a load transistor and driving transistors, and said memory transistors are operative in a ratioless mode so that the output level thereof does not depend on a ratio between a load transistor and driving transistors.

21. A logic circuit according to claim 20 wherein said load transistors in said first and second decodor matrixes are depletion mode MISFETs each gate of which is connected to it's source.

22. A semiconductor read only memory including a first decoder circuit comprising:

a plurality of input lines;
a plurality of output lines;
a first reference potential terminal to which a first source of reference potential is applied;
a plurality of load elements connected between respective ones of said output lines and said first reference potential terminal;
a second reference potential terminal to which a second source of reference potential is applied; and
plural groups of switching elements connected in series between respective ones of said load elements and said second reference potential terminal, the switching elements of each group having control inputs selectively connected to said input lines in accordance with a prescribed code pattern, so that the number of output lines to be selected in response to address signals applied to said input lines is less than the number of output lines not selected; and
wherein said load and switching elements are such that current flows through a load element only if said load element is connected to a selected output line, and further including a second decoder circuit comprising
a plurality of input lines respectively connected to the output lines of said first decoder circuit;
a plurality of output lines;
a controlled switching circuit connected to said second reference potential terminal; and
plural groups of switching elements connected in series between said controlled switching circuit and the respective output lines of said second decoder circuit, the switching elements of each group having control inputs selectively connected to the input lines of said second decoder circuit, in accordance with a predetermined code pattern;

a third decoder circuit comprising
a plurality of input lines;
a plurality of output lines;
a plurality of load elements connected between respective ones of the output lines of said third decoder circuit and said first reference potential terminal; and
plural groups of switching elements connected in parallel between respective ones of the load elements of said third decoder circuit and said second reference potential terminal, the switching elements of each group having control inputs selectively connected to the input lines of said third decoder circuit in accordance with a pre-established code pattern; and a fourth decoder circuit comprising
a plurality of input lines respectively connected to the output lines of said third decoder circuit;
a plurality of output lines;
a controlled charge storage circuit connected between each of the output lines of said fourth decoder circuit and said first reference potential terminal; and
plural groups of at least one switching element each, connected in series between the output lines of said second and fourth decoder circuits, the switching elements of each group having control inputs selectively connected to the output lines of said third decoder circuit in accordance with a selected code pattern;

means for applying address signals to the input lines of said first and third decoder circuits and for controlling the controlled switching circuit of said second decoder circuit in accordance with a first clock signal; and means for applying a second clock signal, shifted in phase relative to said first clock signal, to the controlled charge storage circuit of said fourth decoder circuit.

23. A semiconductor read only memory according to claim 22, wherein the code patterns of said first and second decoder circuits correspond to word code patterns, while the code patterns of said third and fourth decoder circuits correspond to bit code patterns.

24. A semiconductor read only memory according to claim 23, wherein said fourth decoder circuit further comprises a controlled transfer gate circuit connected to each of the output lines of said fourth decoder circuit and being controlled by said first clock signal for reading out the contents of said fourth decoder circuit.

25. A logic circuit comprising a plurality of series connection circuits each including a plurality of transistors which are connected in series, said series connection circuits having a common output terminal and being connected in parallel between said common output terminal and another common terminal, and first means for selecting only one of said series circuits to enabling to form a conduction path between said common output terminal and said another common terminal by way of the one, wherein said first means comprising at least one transistor in each of said series circuits, and said transistors are arrayed along a plurality of rows and columns and said series circuits are also arrayed along said rows to form a memory matrix, and further comprising an address decoder having plural sets of true and complement address inputs and including a first decoder matrix and a second decoder matrix each comprising plural outputs and a plurality of transistors selectively arrayed along a plurality of rows and columns, one of first and second decoder matrixes being responsive to different sets of said address inputs from the other, said outputs of said second decoder matrix being supplied to the transistors in the first means of said memory matrix and said outputs of said first decoder matrix being supplied to the other transistors in said memory matrix.

26. A logic circuit according to claim 25, wherein for each of said first and second decoder matrices the transistors in each column are connected in series.

27. A logic circuit according to claim 26, wherein all of said transistors in said first and second decoder matrices are MISFETs, said first and second decoder matrices each being operative in a ratio mode, so that each output level thereof depends on a ratio between a load transistor and driving transistors, and said memory transistors are operative in a ratio less mode so that the output level thereof does not depend on a ratio between a load transistor and driving transistors.

28. A logic circuit according to claim 27, wherein said load transistors in said first and second decoder matrixes are depletion mode MISFETs each gate of which is connected to it's source.

29. A logic circuit according to claim 25, wherein in said first decoder matrix the transistors in each column are connected in series and in said second decoder matrix the transistors in each column are connected in parallel.

30. A logic circuit according to claim 29, wherein all of said transistors in said first and second decoder matrices are MISFETs, said first and second decoder matrices each being operative in a ratio mode so that each output level thereof depends on a ratio between a load transistor and driving transistors, and said memory transistors are operative in a ratioless mode so that the output level thereof does not depend on a ratio between a load transistor and driving transistors.

31. A logic circuit according to claim 30, wherein said load transistors in said first and second decoder matrixes are depletion mode MISFETs each gate of which is connected to it's source.

32. A semiconductor read only memory including a first decoder circuit comprising:

a plurality of input lines;

a plurality of output lines;

a first reference potential terminal to which a first source of reference potential is applied;

a plurality of load elements connected between respective ones of said output lines and said first reference potential terminal;

a second reference potential terminal to which a second source of reference potential is applied; and plural groups of switching elements connected in series between respective ones of said load elements and said second reference potential terminal, the switching elements of each group having control inputs selectively connected to said input lines in accordance with a prescribed code pattern, so that the number of output lines to be selected in response to address signals applied to said input lines is less than the number of output lines not selected; and wherein said load and switching elements are such that current flows through a load element only if said load element is connected to a selected output line and further including a second decoder circuit comprising a plurality of input lines respectively connected to the output lines of said first decoder circuit;

a plurality of output lines;

a controlled switching circuit connected to said second reference potential terminal; and plural groups of switching elements connected to series between said controlled switching circuit and the respective output lines of said second decoder circuit, the switching elements of each group having control inputs selectively connected to the input lines of said second decoder circuit in accordance with a predetermined code pattern;

a third decoder circuit comprising a plurality of input lines;

a plurality of output lines;

a plurality of load elements connected between respective ones of the output lines of said third decoder circuit and said first reference potential terminal; and plural groups of switching elements connected in series between respective ones of the load elements of said third decoder circuit and said second reference potential terminal, the switching elements of each group having control inputs selectively connected to the input lines of said third decoder circuit in accordance with a pre-established code pattern; and a fourth decoder circuit comprising a plurality of input lines respectively connected to the output lines of said third decoder circuit;

a plurality of output lines;

a controlled charge storage circuit connected between each of the output lines of said fourth decoder circuit and said first reference potential terminal; and plural groups of switching elements connected in series between the output lines of said second and fourth decoder circuits, the switching elements of each group having control inputs selectively connected to the output lines of said third decoder circuit in accordance with a selected code pattern;

means for applying address signals to the input lines of said first and third decoder circuits and for controlling the controlled switching circuit of said second decoder circuit in accordance with a first clock signal; and means for applying a second clock signal, shifted in phase relative to said first clock signal, to the controlled charge storage circuit of said fourth decoder circuit.

33. A semiconductor read only memory according to claim 32, wherein the code patterns of said first and second decoder circuits correspond to word code patterns, while the code patterns of said third and fourth decoder circuits correspond to bit code patterns.

34. A semiconductor read only memory according to claim 33, wherein said fourth decoder circuit further comprises a controlled transfer gate circuit connected to each of the output lines of said fourth decoder circuit and being controlled by said first clock signal for reading out the contents of said fourth decoder circuit.

* * * * *